US009651870B2

(12) United States Patent
Chen et al.

(10) Patent No.: US 9,651,870 B2
(45) Date of Patent: May 16, 2017

(54) METHOD AND TOOL OF LITHOGRAPHY (71) Applicant: TAIWAN SEMICONDUCTOR MANUFACTURING CO., LTD., Hsinchu (TW)

(72) Inventors: Tsung-Pao Chen, Taichung (TW); Sheng-Min Chuang, Taichung (TW); Teng-Kuei Chuang, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/263,776

(22) Filed: Apr. 28, 2014

(65) Prior Publication Data

US 2015/0309414 A1    Oct. 29, 2015

(51) Int. Cl.
*G03F 7/38* (2006.01)

(52) U.S. Cl.
CPC ..................... *G03F 7/38* (2013.01)

(58) Field of Classification Search
CPC ..................... G03F 7/26; G03F 7/38
See application file for complete search history.

(56) References Cited

U.S. PATENT DOCUMENTS

| | | | | |
|---|---|---|---|---|
| 6,664,031 | B2 * | 12/2003 | Jung | G03F 7/36 430/322 |
| 6,839,126 | B2 | 1/2005 | Yen et al. | |
| 7,799,514 | B1 * | 9/2010 | Subramanian | G03F 7/265 430/322 |
| 8,383,322 | B2 * | 2/2013 | Chang | G03F 7/2041 430/311 |
| 2013/0323651 | A1 * | 12/2013 | Solak | G03F 7/201 430/322 |

OTHER PUBLICATIONS

Lalovic et al., "Focus Drilling for Increased Process Latitude in High-NA Immersion Lithography", SPIE Microlithography Symposium 2011, Optical Microlithography XXIV, San Jose, CA, Feb. 27-Mar. 4, 2011.

* cited by examiner

*Primary Examiner* — Kathleen Duda
(74) *Attorney, Agent, or Firm* — Maschoff Brennan (57) ABSTRACT

A tool and a method of lithography are provided. In various embodiments, the method of lithography includes forming a photoresist layer on a substrate. The method further includes exposing the photoresist layer to form an exposed photoresist layer. The method further includes rinsing the exposed photoresist layer. The method further includes treating the exposed photoresist layer with a chemical modifier to form a modified photoresist layer. The method further includes baking the modified photoresist layer. The method further includes developing the modified photoresist layer.

15 Claims, 9 Drawing Sheets

METHOD AND TOOL OF LITHOGRAPHY

BACKGROUND

When electronic products are becoming smaller in size and more intelligent with a high performance and a high reliability, requirements to integrated circuit (IC) fabrication techniques are accordingly increased for higher integration density of IC.

Among these IC fabrication techniques, lithography process is an important technique used in forming selected circuit patterns on a substrate such as a semiconductor wafer. In general, a photoresist film can be deposited onto the substrate during this process and thereafter pattern-exposed to lithographic equipment in order to transcribe a selected circuit pattern. The photoresist film is subsequently developed with a developer solution to obtain a resist pattern corresponding to the transcribed pattern. The developer is intended to remove the relatively more soluble areas of photoresist, and leave behind the remaining patterned photoresist film, which usually serves as a mask for etching multiple thin film layers on the substrate wafer. Since integration density of IC are increased in fabrication of semiconductor devices, advanced lithography techniques are accordingly required in producing smaller critical dimensions (CDs) and fine patterns including, for example, contact holes having smaller opening sizes or spaces having smaller widths. To fabricate such smaller critical CDs and fine patterns, it is necessary to continually increase patterning resolution in lithography technology.

Because requirement for higher patterning resolution in lithography technology keeps increasing, precise formation of desired pattern profile in the photoresist film on the substrate wafer becomes even challenging and difficult. The process window of formation of desired pattern profile in the photoresist film also becomes more marginal with the more advanced technology node. As such, improvements in tools and methods of the lithography technology continue to be sought.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The singular forms "a," "an" and "the" used herein include plural referents unless the context clearly dictates otherwise. Therefore, reference to, for example, a liner layer includes embodiments having two or more such liner layers, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

As aforementioned, patterning resolution is continually increased in lithography technology to fabricate such smaller critical CDs and fine patterns. Therefore, exposure wavelength is shortened and/or numerical aperture is increased for higher patterning resolution. However, shortening the exposure wavelength and/or increasing the numerical aperture would simultaneously limit a depth-of-focus (DOF). The limited DOF would lead to significant pattern variation, and result in either V-shaped or undercut photoresist profiles as opposed to an ideal photoresist profile having vertical sidewalls. In this regard, a method and a tool of lithography are provided according to various embodiments of the present disclosure.

Figure 1:
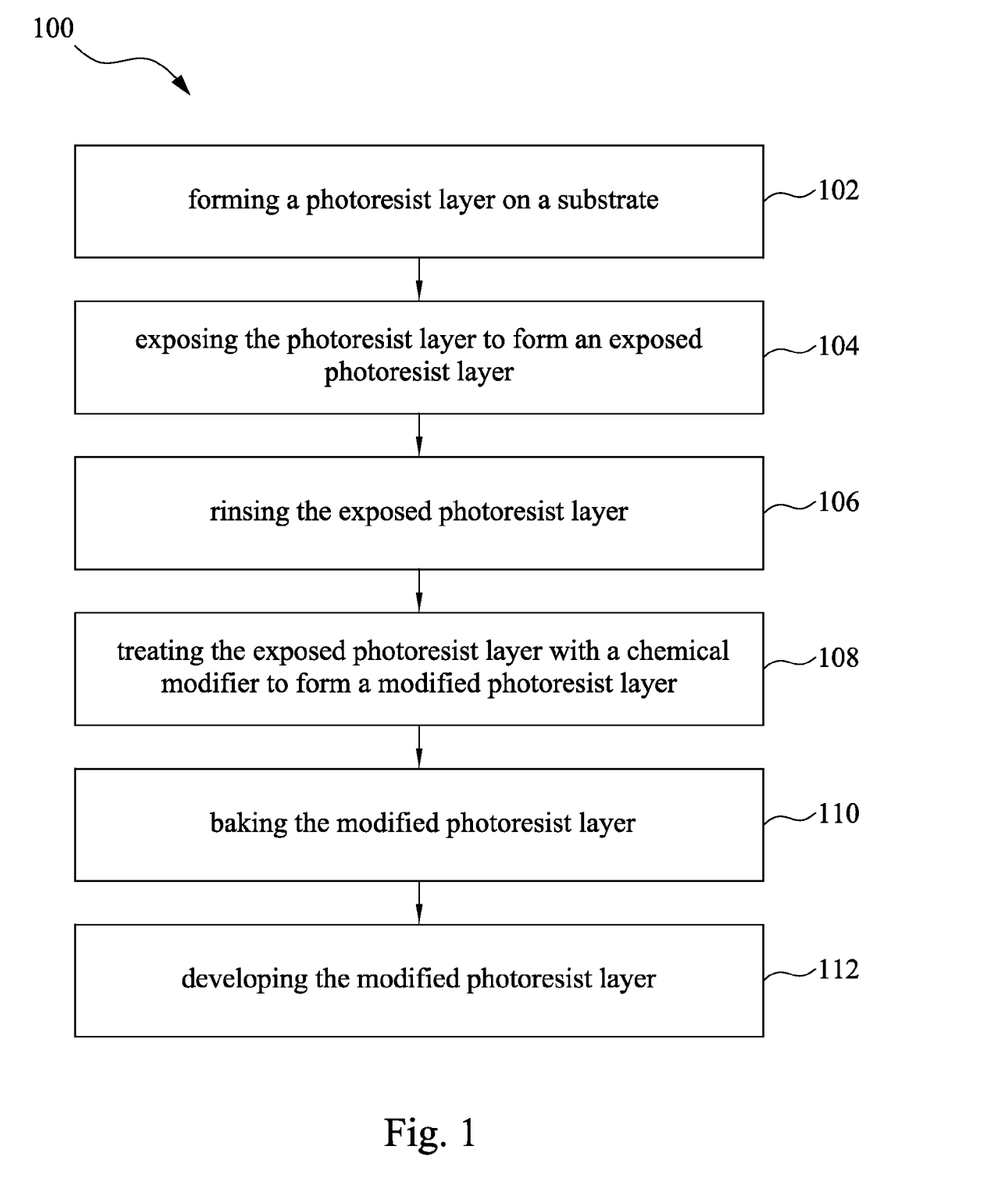
FIG. 1 is a flowchart illustrating a method of lithography according to various embodiments of the present disclosure.

FIG. 1 is a flowchart illustrating a method 100 of lithography according to various embodiments of the present disclosure. The method 100 begins with block 102 in which a photoresist layer is formed on a substrate. The method 100 continues with block 104 in which the photoresist layer is exposed to form an exposed photoresist layer. In various embodiments of the present disclosure, the substrate is substantially horizontal and stable during the operation of exposing the photoresist layer. In various embodiments of the present disclosure, the substrate is tilted and moving during the operation of exposing the photoresist layer. The method 100 also includes rinsing the exposed photoresist layer as shown in block 106. The method 100 continues with block 108 in which the exposed photoresist layer is treated with a chemical modifier to form a modified photoresist layer. The operation of treating the exposed photoresist layer with the chemical modifier (block 108) could be simultaneously performed with the operation of rinsing the exposed photoresist layer (block 106). In various embodiments of the present disclosure, the operation of treating the exposed photoresist layer with the chemical modifier (block 108) is performed after the operation of rinsing the exposed photoresist layer (block 106). In various embodiments of the present disclosure, the operation of treating the exposed photoresist layer with the chemical modifier (block 108) is performed by injecting a gas as the chemical modifier to a surface of the exposed photoresist layer. In various embodiments of the present disclosure, the chemical modifier includes an acidic fluid. In various embodiments of the present disclosure, the acidic fluid includes carbon oxides, nitrogen oxides, sulfur oxides, carbonic acid, nitric acid, sulfuric acid, or combinations thereof. In various embodiments of the present disclosure, the chemical modifier includes an alkaline fluid. In various embodiments of the present disclosure, the alkaline fluid includes ammonia, trimethylamine, ammonium hydroxide, tetramethyl ammonium hydroxide, sodium hydroxide, or combinations thereof. The method 100 further includes baking the modified photoresist layer as shown in block 110. The method 100 continues with block 112 in which the modified photoresist layer is developed. The method 100 of lithography described according to various embodiments of the present disclosure could be used to pattern a semiconductor wafer, a mask, a portion of the semiconductor wafer, or a portion of the mask. The details of the methods 100 are further illustrated in FIGS. 2-13 and described in following paragraphs.

Figure 2:
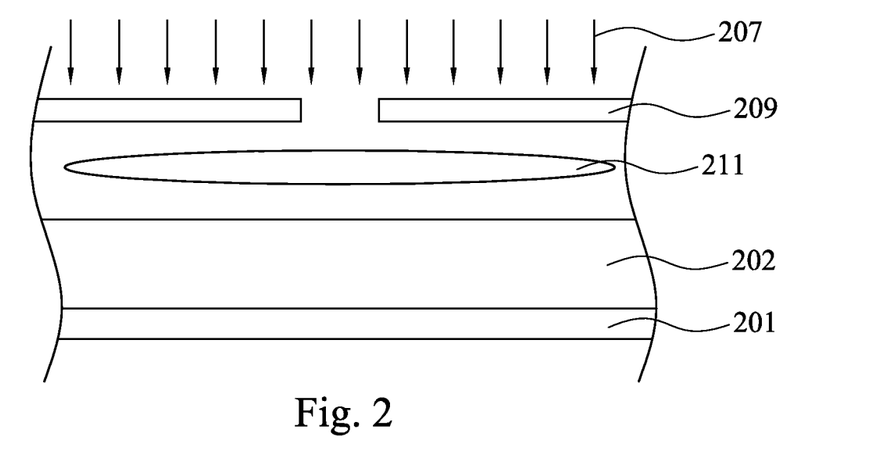
FIG. 2 is a schematic view of at least a portion of the substrate in an intermediate stage of the method of lithography according to various embodiments of the present disclosure.

FIG. 2 is a schematic view of at least a portion of the substrate in an intermediate stage of the method of lithography according to various embodiments of the present disclosure. Referring to FIG. 2, a photoresist layer 202 is formed on a substrate 201. The photoresist layer 202 could be formed on the substrate 201 by a suitable process such as spin coating process. For example, a soft baking and chilling process could be implemented after the photoresist layer 202 is formed on the substrate 201. The photoresist layer 202, for example, could be poly (4-t-butoxycarbonyloxystyrene), polymethylmethacrylate (PMMA), tetrafluoroethylene (TFE), or other suitable photoresist materials. In various embodiments of the present disclosure, the photoresist layer 202 includes a photo acid generator, and the photo acid generator includes diazonaphthoquinone (DNQ), triphenylsulfonium (TPSHFA), hexafluoroantimonate, or combinations thereof. The photoacid generator could decompose when it is induced by a photon in the following exposing operation, and forms a small amount of acid, which further induces a cascade of chemical transformations in the photoresist layer 202.

Referring to FIG. 2, the substrate 201 could be a semiconductor wafer. The semiconductor wafer could include an elementary semiconductor, a compound semiconductor, an alloy semiconductor, or combinations thereof. The semiconductor wafer could further include doped regions therein. The semiconductor wafer could also further include a plurality of patterned dielectric layers and patterned conductive layers combined to form interconnections. For example, the substrate 201 could be a silicon wafer. However, the present disclosure is not limited to it.

Figure 3:
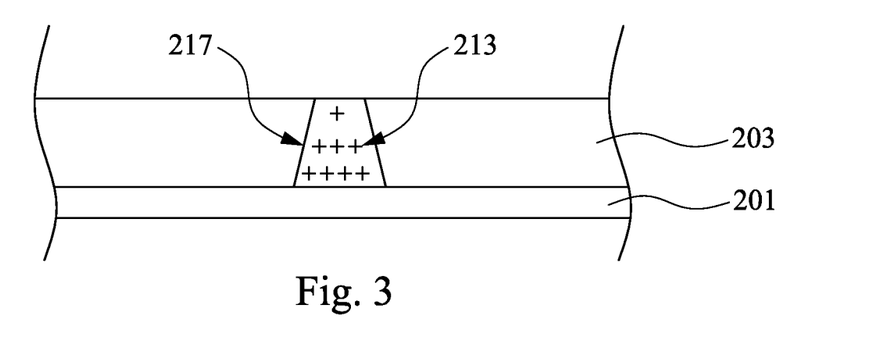
FIG. 3 is a schematic view of the substrate shown in FIG. 2 in a subsequent stage of the method of lithography according to various embodiments of the present disclosure.

FIG. 3 is a schematic view of the substrate shown in FIG. 2 in a subsequent stage of the method of lithography according to various embodiments of the present disclosure. Referring to FIG. 2 and FIG. 3, after the operation of forming the photoresist layer 202 on the substrate 201, the photoresist layer 202 is exposed to form an exposed photoresist layer 203. As illustrated in FIG. 2, the operation of exposing the photoresist layer 202, for example, could be performed by applying a radiation beam 207, a photomask 209, and a projection lens 211 above the photoresist layer 202. The radiation beam 207 could be a KrF excimer laser (248 nm), an ArF excimer laser (193 nm), and/or F2 excimer laser (157 nm). For example, the photomask 209 could include a transparent substrate and an absorption layer. The transparent substrate may use fused silica, calcium fluoride, or other suitable material. The absorption layer may be formed using a plurality of processes and materials, such as depositing a metal film made with chromium and iron oxide. The absorption layer may be patterned to have one or more openings where light may travel through without being absorbed and have one or more absorption areas where light may be completely or partially blocked. The photomask 209 could include a binary mask, a phase shift mask (PSM), or an optical proximate correction (OPC). As illustrated in FIG. 2, the photoresist layer 202 on the substrate 201 could be exposed to an ultraviolet light through the photomask 209 having a predefined pattern. The operation of exposing the photoresist layer 202 could be implemented using a stepper by a step-and-repeat method or using a scanner by a step-and-scan method. A pattern could be written to the photoresist layer 202 according to the predefined pattern of the photomask 209. However, the present disclosure is not limited to it. The operation of exposing the photoresist layer 202 could be further extended to include other technologies such as a maskless exposure process. Besides, during the operation of exposing the photoresist layer 202, the substrate 201 could be tilted to extend the DOF for forming ideal photoresist profile having vertical sidewalls. As illustrated in FIG. 3, in various embodiments of the present disclosure, the substrate is substantially horizontal and stable during the operation of exposing the photoresist layer. It should be noticed that the CD uniformity could be further improved since the substrate is substantially horizontal and stable during the operation of exposing the photoresist layer.

As illustrated in FIG. 3, the exposed photoresist layer 203 is formed. As aforementioned, a portion of the photoresist layer 202 is exposed and the portion is transformed during the operation of exposing the photoresist layer 202. The pattern is written to the photoresist layer 202 such that the exposed photoresist layer 203 is formed. For example, the radiation beam 207 decomposes the photoresist layer 202 and causes an amount of acids 213 (labeled as "+" in FIG. 3) to be formed within the portion of the photoresist layer 202. The profile of the portion depends on depth-of-focus (DOF) of the lithography system in the operation of exposing the photoresist layer 202. A limited DOF may result in a relatively small quantity of photo acids being produced in a defocused area. Such a limited DOF (such as lithography at lower focal) could result in an undercut photoresist profile (such as a distribution profile 217 of the photo acids 213 in the exposed photoresist layer 203 illustrated in FIG. 3), as opposed to an ideal photoresist profile having vertical sidewalls.

Figure 4:
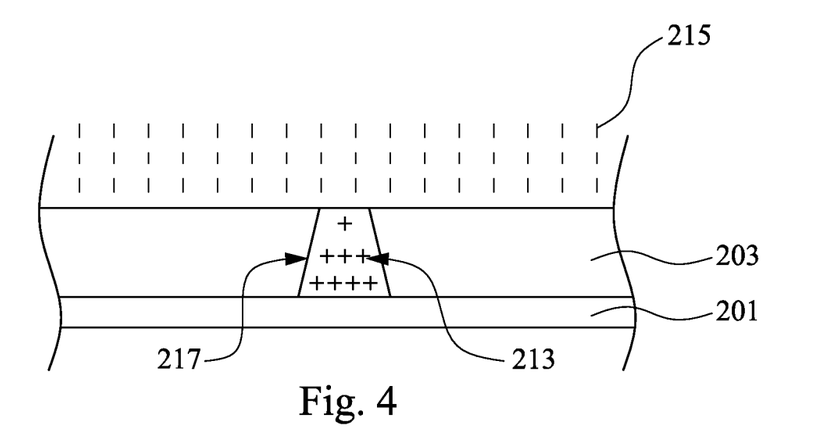
FIG. 4 is a schematic view of the substrate shown in FIG. 3 in a subsequent stage of the method of lithography according to various embodiments of the present disclosure.

FIG. 4 is a schematic view of the substrate shown in FIG. 3 in a subsequent stage of the method of lithography according to various embodiments of the present disclosure. Referring to FIG. 4, after the operation of exposing the photoresist layer 202 to form an exposed photoresist layer 203, the exposed photoresist layer 203 is rinsed. Therefore, the particles or other impurities generated during the operation of exposing the photoresist layer 202 could be removed. As illustrated in FIG. 4, for example, the exposed photoresist layer 203 could be rinsed by liquid solvent 215 such as water, acetone, or other suitable solvents to remove particles or other impurities generated during the operation of exposing the photoresist layer 202. In addition, the operation of rinsing the exposed photoresist layer 203 could be performed by liquid solvents such as water, and therefore the exposed photoresist layer 203 could be wetted for following operations.

Figure 5:
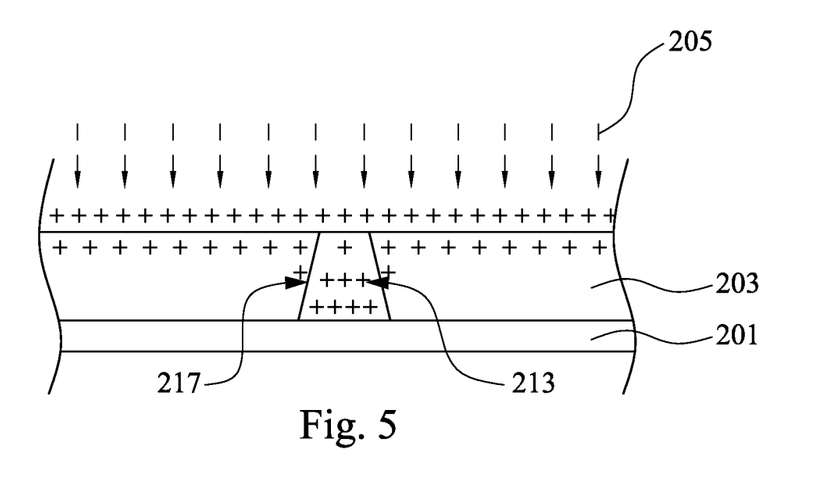
FIG. 5 is a schematic view of the substrate shown in FIG. 4 in a subsequent stage of the method of lithography according to various embodiments of the present disclosure.
Figure 6:
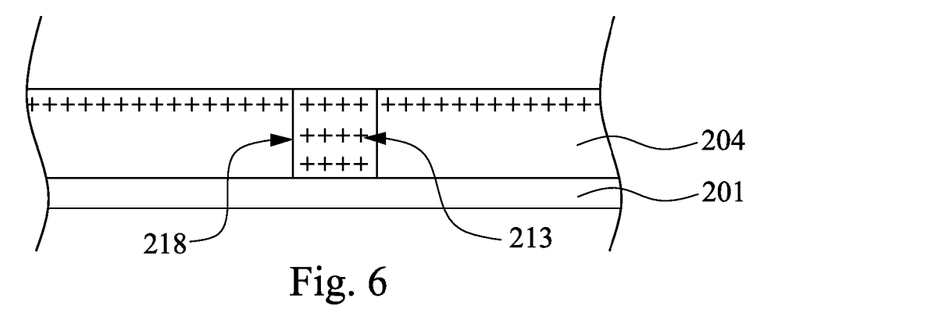
FIG. 6 is a schematic view of the substrate shown in FIG. 5 in a subsequent stage of the method of lithography according to various embodiments of the present disclosure.

FIG. 5 is a schematic view of the substrate shown in FIG. 4 in a subsequent stage of the method of lithography according to various embodiments of the present disclosure. FIG. 6 is a schematic view of the substrate shown in FIG. 5 in a subsequent stage of the method of lithography according to various embodiments of the present disclosure. Referring to FIG. 5, after the operation of rinsing the exposed photoresist layer 203, the exposed photoresist layer 203 is treated with a chemical modifier 205 to form a modified photoresist layer 204. In various embodiments of the present disclosure, the chemical modifier 205 includes an acidic fluid. As illustrated in FIG. 5 and FIG. 6, the chemical modifier 205 including acid increases the quantity of acids (labeled as "+" in FIG. 5) in the defocused area, so that the distribution profile 217 of the photo acids 213 in the exposed photoresist layer 203 could be modified into a modified distribution profile 218 of the photo acids 213 in the modified photoresist layer 204. As illustrated in FIG. 6, the modified distribution profile 218 of the photo acids 213 in the modified photoresist layer 204 is similar to the ideal profile, which has vertical walls. Therefore, the undercut profiles (as the distribution profile 217 of the photo acids 213 in the exposed photoresist layer 203) could be modified by the chemical modifier 205 with the quantity of acids in the defocused area as illustrated in FIG. 5, so that the modified distribution profile 218 of the photo acids 213, which as vertical walls, in the modified photoresist layer 204 is obtained as illustrated in FIG. 6. The increased quantity of photo acids 213 in the defocused area could be accomplished by treating the chemical modifier 205 to the exposed photoresist layer 203. The acid component in the chemical modifier 205 could diffuse or migrate into the exposed photoresist layer 203 and forms a counter acid profile having a gradient distribution in exposed photoresist layer 203 in addition to the distribution profile 217 of the photo acids 213 in the exposed photoresist layer 203 generated by the operation of exposing the photoresist layer 202 to form the exposed photoresist layer 203. The acid contribution from both the operation of exposing the photoresist layer 202 and the operation of treating the exposed photoresist layer 203 with the chemical modifier 205 adds up to produce the modified distribution profile 218 as shown in FIG. 6, which is more close to an improved exposed resist profile having vertical sidewalls. It should be noticed that the chemical modifier 205 could be acidic gas for modifying the distribution profile 217 of the photo acids 213. In various embodiments of the present disclosure, the acidic fluid includes carbon oxides, nitrogen oxides, sulfur oxides, carbonic acid, nitric acid, sulfuric acid or combinations thereof. Therefore, the chemical modifier 205 could spread onto a surface of the exposed photoresist layer 203 more uniformly and diffuse into the exposed photoresist layer 203 more easily. Furthermore, less residue of the chemical modifier 205 is left onto the surface of the modified photoresist layer 204 after the operation of treating the exposed photoresist layer 203 with the chemical modifier 205 since acidic gas could evaporate easily. On the other hand, since the undercut profiles (as the distribution profile 217 in FIG. 5) could be modified by the chemical modifier 205 and be transformed into the ideal profile (as the distribution profile 218 in FIG. 6), scan-tilt for forming ideal photoresist profile having vertical sidewalls is not necessary. Furthermore, scan-tilt could also bring high cost and vibration concerns during the operation of exposing the photoresist layer to form an exposed photoresist layer. Therefore, the CD uniformity could be further improved since the substrate could be substantially horizontal and stable during the operation of exposing the photoresist layer without being tilted or moving. Besides, costs of the operation of exposing the photoresist layer are also significantly reduced since scan-tilt for forming ideal photoresist profile having vertical sidewalls is not necessary.

Figure 7:
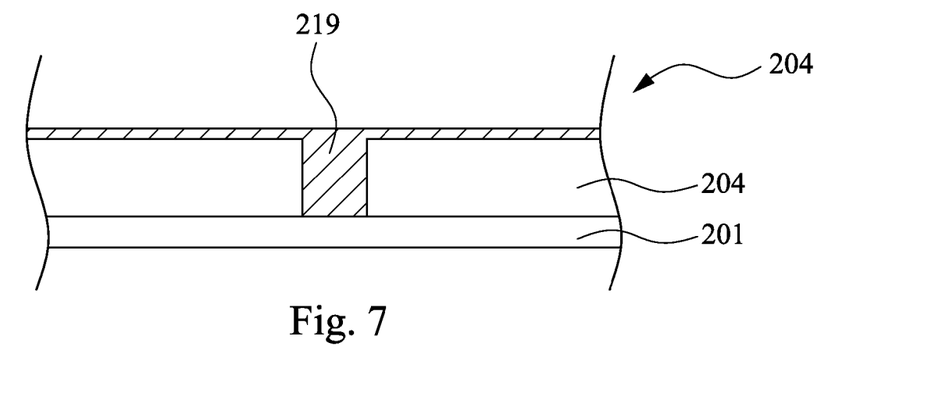
FIG. 7 is a schematic view of the substrate shown in FIG. 6 in a subsequent stage of the method of lithography according to various embodiments of the present disclosure.
Figure 8:
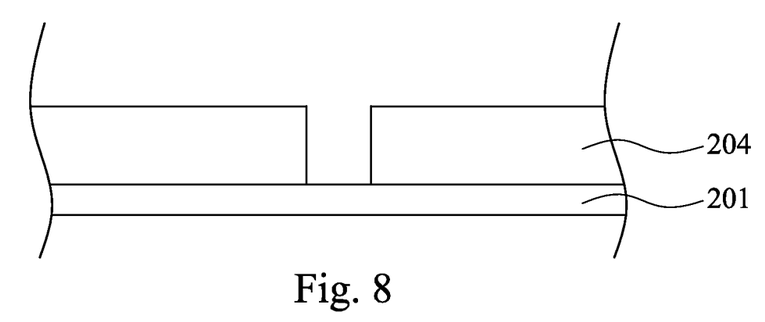
FIG. 8 is a schematic view of the substrate shown in FIG. 7 in a subsequent stage of the method of lithography according to various embodiments of the present disclosure.

FIG. 7 is a schematic view of the substrate shown in FIG. 6 in a subsequent stage of the method of lithography according to various embodiments of the present disclosure. FIG. 8 is a schematic view of the substrate shown in FIG. 7 in a subsequent stage of the method of lithography according to various embodiments of the present disclosure. Referring to FIG. 7, after the operation of treating the exposed photoresist layer 203 with the chemical modifier 205, the modified photoresist layer 204 is baked. As illustrated in FIG. 7, the modified photoresist layer 204 is baked at an elevated temperature, and therefore the distribution of the photo acids in the modified photoresist layer 204 is transformed into a portion 219, which could be washed away by a developer in the following operation. After the operation of baking the modified photoresist layer, the modified photoresist layer 204 is developed by the developer solution and leaves the predetermined pattern as illustrated in FIG. 8. As illustrated from FIG. 2 to FIG. 8, the photoresist layer is illustrated as a positive-type photoresist (the photoresist layer that is exposed to the radiation is removed by the developer). However, the present disclosure is not limited to it, and the photoresist layer could also be a negative-type photoresist. The developer could be aqueous tetramethyl-ammonium hydroxide (TMAH), or other suitable solvents. The method 100 could proceed to rinsing, drying, and/or other suitable processes. As illustrated in FIG. 8, the patterned modified photoresist layer 204 could be used as a masking element in performing one or more processes on underlying layers such as etching, ion implantation, deposition, and/or other suitable processes including those typical of an integrated circuit process. The modified photoresist layer 204 could be subsequently stripped from the substrate 201.

Figure 9:
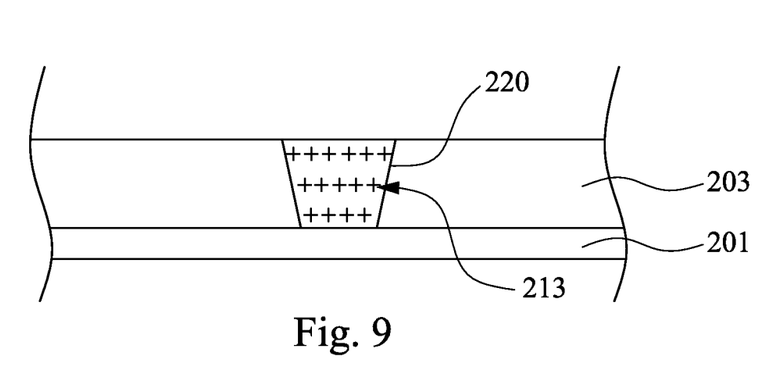
FIG. 9 is a schematic view of the substrate shown in FIG. 2 in a subsequent stage of the method of lithography according to other various embodiments of the present disclosure.

FIG. 9 is a schematic view of the substrate shown in FIG. 2 in a subsequent stage of the method of lithography according to other various embodiments of the present disclosure. Referring to FIG. 9, after the operation of forming the photoresist layer 202 on the substrate 201, the photoresist layer 202 is exposed to form an exposed photoresist layer 203. As aforementioned and illustrated in FIG. 2, the operation of exposing the photoresist layer 202, for example, could be performed by applying a radiation beam 207, a photomask 209, and a projection lens 211 above the photoresist layer 202. The radiation beam 207 could be a KrF excimer laser (248 nm), an ArF excimer laser (193 nm), and/or F2 excimer laser (157 nm). The exposure process are similar to those described above, and therefore the details are omitted here. It should be noticed that the exposed photoresist layer 203 is formed as illustrated in FIG. 9. As aforementioned, a portion of the photoresist layer 202 is exposed and the portion is transformed during the operation of exposing the photoresist layer 202. The pattern is written to the photoresist layer 202 such that the exposed photoresist layer 203 is formed. The profile of the portion depends on depth-of-focus (DOF) of the lithography system in the operation of exposing the photoresist layer 202. A limited DOF may result in a relatively small quantity of photo acids being produced in a defocused area. Such a limited DOF (such as lithography at upper focal) could result in a V-shaped photoresist profile (such as a distribution profile 220 of the photo acids 213 in the exposed photoresist layer 203 illustrated in FIG. 9), as opposed to an ideal photoresist profile having vertical sidewalls.

Figure 10:
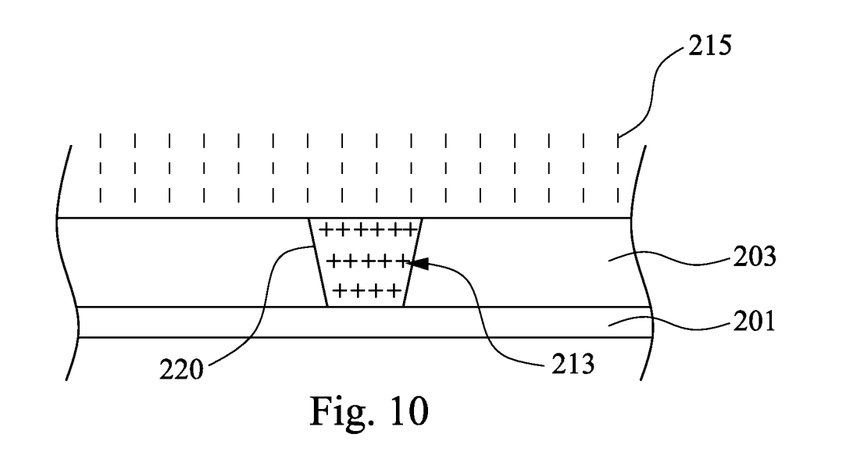
FIG. 10 is a schematic view of the substrate shown in FIG. 9 in a subsequent stage of the method of lithography according to other various embodiments of the present disclosure.

FIG. 10 is a schematic view of the substrate shown in FIG. 9 in a subsequent stage of the method of lithography according to various embodiments of the present disclosure. Referring to FIG. 10, after the operation of exposing the photoresist layer 202 to form an exposed photoresist layer 203, the exposed photoresist layer 203 is rinsed. Therefore, the particles or other impurities generated during the operation of exposing the photoresist layer 202 could be removed. As illustrated in FIG. 10, the exposed photoresist layer 203 could be rinsed by liquid solvent 215 such as water, acetone, or other suitable solvents to remove particles or other impurities generated during the operation of exposing the photoresist layer 202. The rinse process are similar to those described above, and therefore the details are omitted here.

Figure 11:
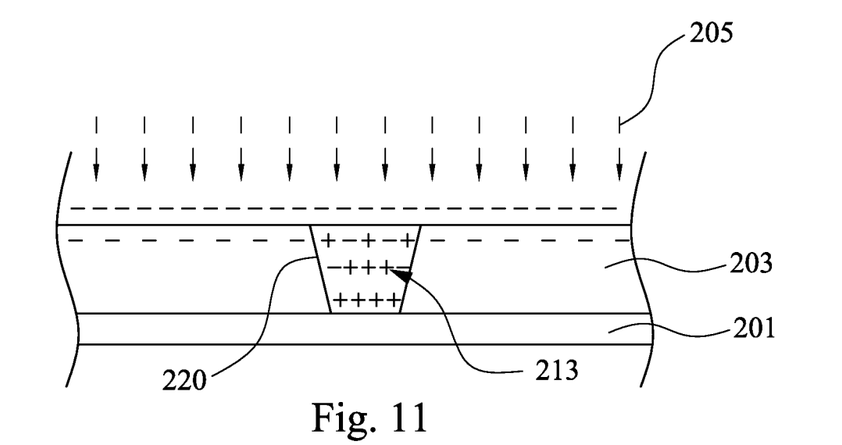
FIG. 11 is a schematic view of the substrate shown in FIG. 10 in a subsequent stage of the method of lithography according to other various embodiments of the present disclosure.
Figure 12:
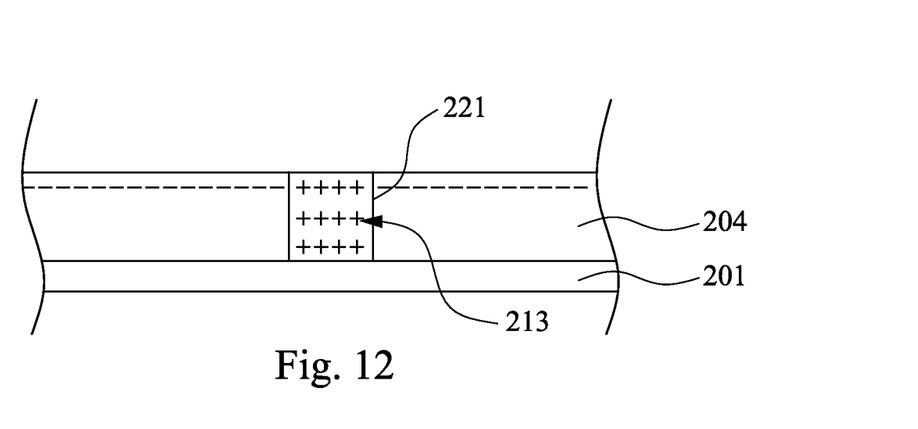
FIG. 12 is a schematic view of the substrate shown in FIG. 11 in a subsequent stage of the method of lithography according to other various embodiments of the present disclosure.

FIG. 11 is a schematic view of the substrate shown in FIG. 10 in a subsequent stage of the method of lithography according to various embodiments of the present disclosure. FIG. 12 is a schematic view of the substrate shown in FIG. 11 in a subsequent stage of the method of lithography according to various embodiments of the present disclosure. Referring to FIG. 11, after the operation of rinsing the exposed photoresist layer 203, the exposed photoresist layer 203 is treated with a chemical modifier 205 to form a modified photoresist layer 204. In various embodiments of the present disclosure, the chemical modifier 205 includes an alkaline fluid. As illustrated in FIG. 11 and FIG. 12, the chemical modifier 205 including base (labeled as "−" in FIG. 11) decreases the quantity of acids (labeled as "+" in FIG. 11) in the upper area, so that the distribution profile 217 of the photo acids 213 in the exposed photoresist layer 203 could be modified into a modified distribution profile 218 of the photo acids 213 in the modified photoresist layer 204. The modified distribution profile 218 of the photo acids 213 in the modified photoresist layer 204 is similar to the ideal profile, which has vertical walls. Therefore, the V-shaped profile (as the distribution profile 220 of the photo acids 213 in the exposed photoresist layer 203) could be modified by the chemical modifier 205, so that the modified distribution profile 221 of the photo acids 213, which as vertical walls, in the modified photoresist layer 204 is obtained as illustrated in FIG. 12. The decreased quantity of photo acids 213 in the upper area could be accomplished by treating the chemical modifier 205 to the exposed photoresist layer 203. The base component in the chemical modifier 205 could diffuse or migrate into the exposed photoresist layer 203 and forms a counter base profile having a gradient distribution in exposed photoresist layer 203 in addition to the distribution profile 217 of the photo acids 213 in the exposed photoresist layer 203 generated by the operation of exposing the photoresist layer 202 to form the exposed photoresist layer 203. The acid contribution from both the operation of exposing the photoresist layer 202 and the operation of treating the exposed photoresist layer 203 with the chemical modifier 205 adds up to produce the modified distribution profile 221 as shown in FIG. 12, which is more close to an improved exposed resist profile having vertical sidewalls. It should be noticed that the chemical modifier 205 could be basic gas for modifying the distribution profile 220 of the photo acids 213. In various embodiments of the present disclosure, the alkaline fluid comprises ammonia, trimethylamine, ammonium hydroxide, tetramethyl ammonium hydroxide, sodium hydroxide, or combinations thereof. Therefore, the chemical modifier 205 could spread onto a surface of the exposed photoresist layer 203 more uniformly and diffuse into the exposed photoresist layer 203 more easily. On the other hand, since the V-shaped profile (as the distribution profile 220 in FIG. 11) could be modified by the chemical modifier 205 and be transformed into the ideal profile (as the distribution profile 221 in FIG. 12), scan-tilt for forming ideal photoresist profile having vertical sidewalls is not necessary. Therefore, the CD uniformity could be further improved since the substrate could be substantially horizontal and stable during the operation of exposing the photoresist layer without being tilted or moving (as scan-tilt). Besides, costs of the operation of exposing the photoresist layer are also significantly reduced since scan-tilt for forming ideal photoresist profile having vertical sidewalls is not necessary.

Figure 13:
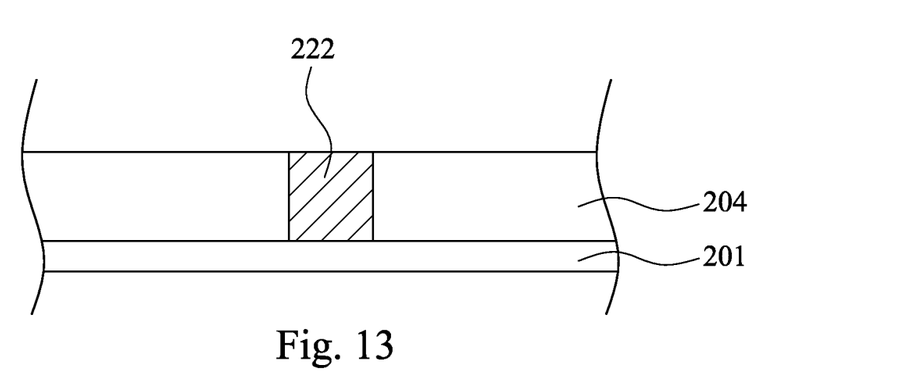
FIG. 13 is a schematic view of the substrate shown in FIG. 12 in a subsequent stage of the method of lithography according to other various embodiments of the present disclosure.
Figure 14:
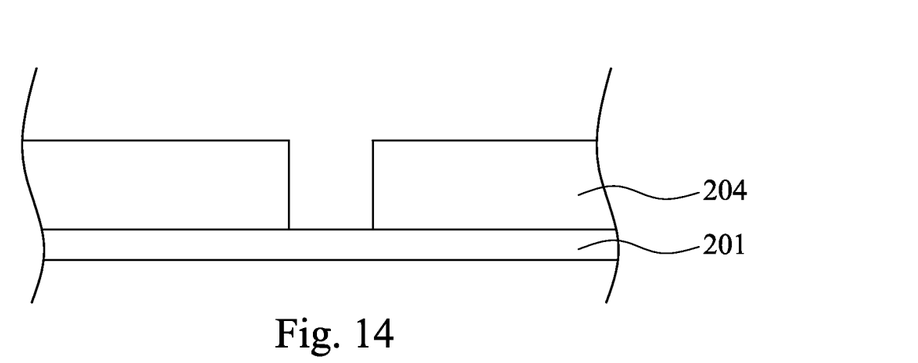
FIG. 14 is a schematic view of the substrate shown in FIG. 13 in a subsequent stage of the method of lithography according to other various embodiments of the present disclosure.

FIG. 13 is a schematic view of the substrate shown in FIG. 12 in a subsequent stage of the method of lithography according to various embodiments of the present disclosure. FIG. 14 is a schematic view of the substrate shown in FIG. 13 in a subsequent stage of the method of lithography according to various embodiments of the present disclosure. Referring to FIG. 13, after the operation of treating the exposed photoresist layer 203 with the chemical modifier 205, the modified photoresist layer 204 is baked. As illustrated in FIG. 13, the modified photoresist layer 204 is baked at an elevated temperature, and therefore the distribution of the photo acids in the modified photoresist layer 204 is transformed into a portion 222, which could be washed away by a developer in the following operation. After the operation of baking the modified photoresist layer, the modified photoresist layer 204 is developed by the developer solution and leaves the predetermined pattern as illustrated in FIG. 14. As illustrated from FIG. 2, FIG. 9 to FIG. 14, the photoresist layer is illustrated as a positive-type photoresist (the photoresist layer that is exposed to the radiation is removed by the developer). However, the present disclosure is not limited to it, and the photoresist layer could also be a negative-type photoresist. The developer could be aqueous tetramethylammonium hydroxide (TMAH), or other suitable solvents. The method 100 could proceed to rinsing, drying, and/or other suitable processes. As illustrated in FIG. 14, the patterned modified photoresist layer 204 could be used as a masking element in performing one or more processes on underlying layers such as etching, ion implantation, deposition, and/or other suitable processes including those typical of an integrated circuit process. The modified photoresist layer 204 could be subsequently stripped from the substrate 201.

Figure 15:
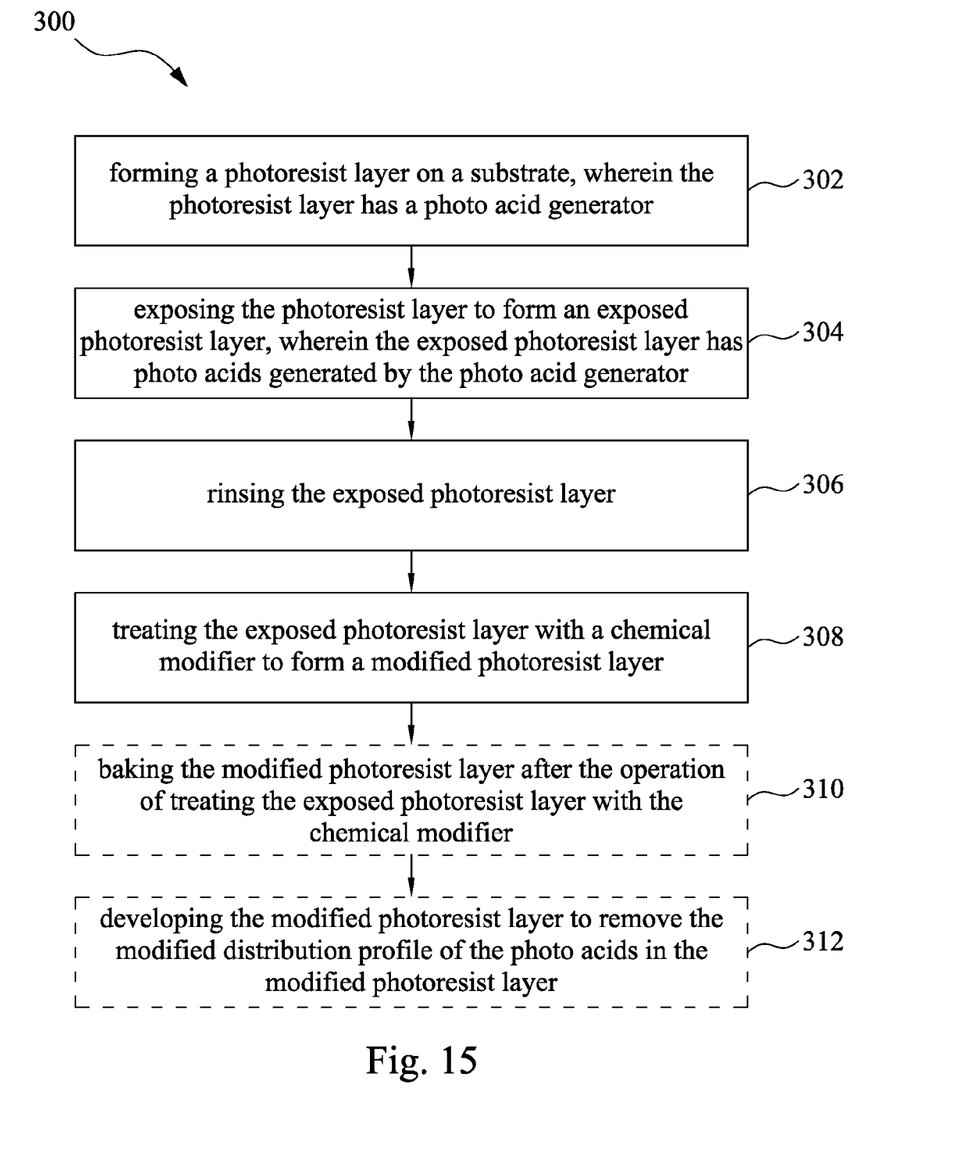
FIG. 15 is a flowchart illustrating a method of lithography according to other various embodiments of the present disclosure.

FIG. 15 is a flowchart illustrating a method of lithography according to other various embodiments of the present disclosure. The method 300 begins with block 302 in which a photoresist layer is formed on a substrate. The photoresist layer has a photo acid generator. In various embodiments of the present disclosure, the photo acid generator comprises diazonaphthoquinone (DNQ), triphenylsulfonium (TP-SHFA), hexafluoroantimonate, or combinations thereof. The method 300 continues with block 304 in which the photoresist layer is exposed to form an exposed photoresist layer. The exposed photoresist layer has photo acids generated by the photo acid generator. The method 300 also includes rinsing the exposed photoresist layer as shown in block 306. The method 300 continues with block 308 in which the exposed photoresist layer is treated with a chemical modifier to form a modified photoresist layer. In various embodiments of the present disclosure, the chemical modifier includes an acidic fluid, and the acidic fluid includes carbon oxides, nitrogen oxides, sulfur oxides, carbonic acid, nitric acid, sulfuric acid, or combinations thereof. In various embodiments of the present disclosure, the chemical modifier includes an alkaline fluid, and the alkaline fluid includes ammonia, trimethylamine, ammonium hydroxide, tetramethyl ammonium hydroxide, sodium hydroxide, or combinations thereof. In various embodiments of the present disclosure, the method 300 further includes baking the modified photoresist layer after the operation of treating the exposed photoresist layer with the chemical modifier as shown in block 310. In various embodiments of the present disclosure, the method 300 continues with block 312 in which the modified photoresist layer is developed to remove the modified distribution profile of the photo acids in the modified photoresist layer.

The method 300 of lithography described according to various embodiments of the present disclosure could be used to pattern a semiconductor wafer, a mask, a portion of the semiconductor wafer, or a portion of the mask. Regarding process details in each operations of the methods 300 are similar to those illustrated in FIGS. 2-14 and described in above paragraphs. Therefore, the details of methods 300 are omitted here. As illustrated in FIG. 5 to FIG. 6, it should be noticed that a distribution profile 217 of the photo acids 213 in the exposed photoresist layer 203 produced in the operation of exposing the photoresist layer is modified by the chemical modifier 205 in the operation of treating the exposed photoresist layer 203. The distribution profile 217 of the photo acids 213 in the exposed photoresist 203 illustrated in FIG. 5 is modified into a modified distribution profile 218 of the photo acids 213 in the modified photoresist layer 204 illustrated in FIG. 6.

Figure 16:
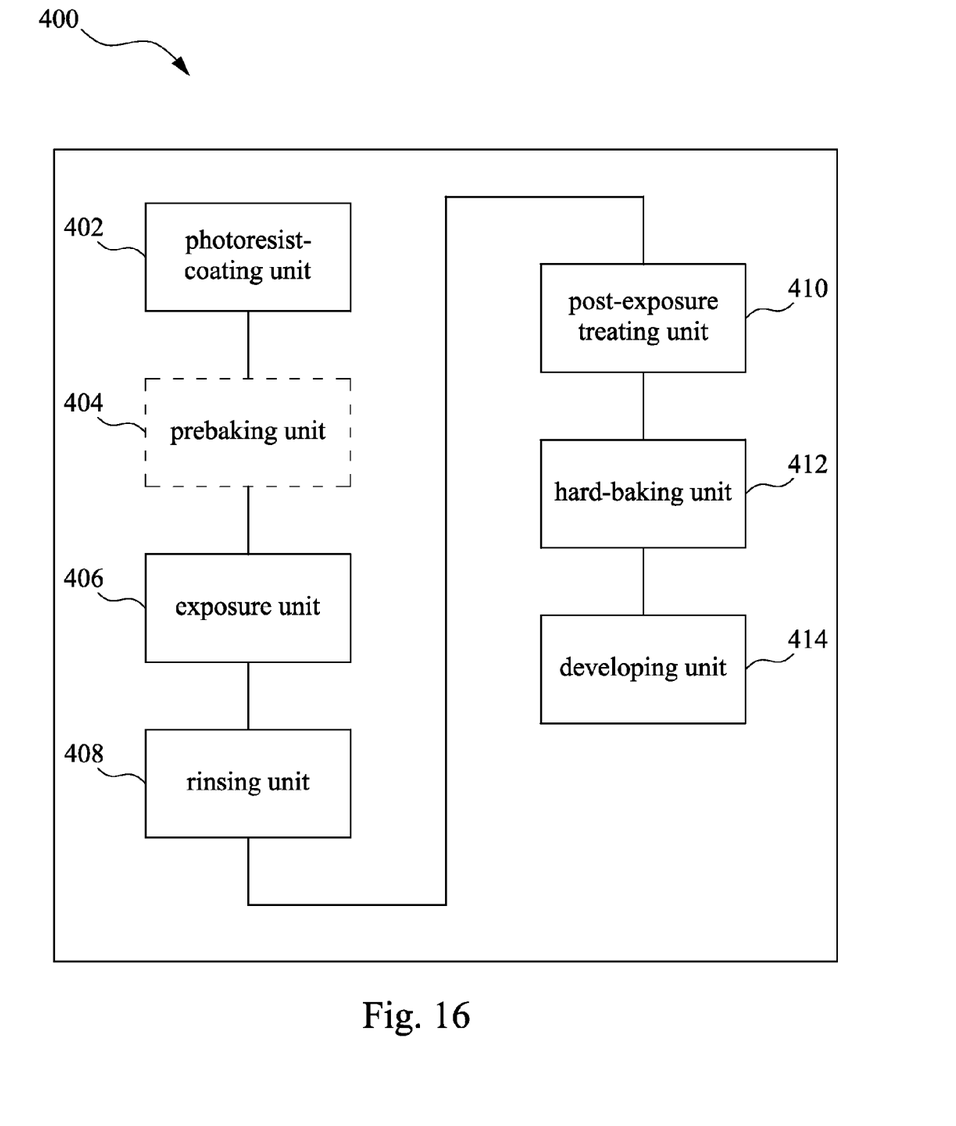
FIG. 16 is a schematic diagram of a tool for the methods of lithography according to various embodiments of the present disclosure.

FIG. 16 is a schematic diagram of a tool 400 for the methods of lithography according to various embodiments of the present disclosure. As illustrated in FIG. 16, the tool 400 includes a photoresist-coating unit 402, an exposure unit 406, a rinsing unit 408, a post-exposure treating unit 410, a hard-baking unit 412, and a developing unit 414. The photoresist-coating unit 402 is configured to coating a photoresist layer (as 202 shown in FIG. 2) on the substrate (as 201 shown in FIG. 2). The exposure unit 406 is configured to performing an exposure process on the photoresist layer (as 202 shown in FIG. 2) and transforming the photoresist layer into an exposed photoresist layer (as 203 shown in FIG. 3). The rinsing unit 408 is configured to cleaning the exposed photoresist layer (as shown in FIG. 4). The post-exposure treating unit 410 is configured to injecting a chemical modifier (as 205 shown in FIG. 5) to the exposed photoresist layer and transforming the exposed photoresist layer into a modified photoresist layer (as 204 shown in FIG. 6). In various embodiments of the present disclosure, the chemical modifier includes an acidic fluid or an alkaline fluid, the acidic fluid comprises carbon oxides, nitrogen oxides, sulfur oxides, carbonic acid, nitric acid, sulfuric acid, or combinations thereof, and the alkaline fluid comprises ammonia, trimethylamine, ammonium hydroxide, tetramethyl ammonium hydroxide, sodium hydroxide, or combinations thereof. Therefore, the chemical modifier could spread onto the surface of the exposed photoresist layer more uniformly and diffuse into the exposed photoresist layer more easily. Furthermore, less residue of the chemical modifier is left onto the surface of the modified photoresist layer after the operation of treating the exposed photoresist layer with the chemical modifier since the acidic and/or basic gas could evaporate easily. The hard-baking unit 412 is configured to baking the photoresist layer. The developing unit 414 is configured to performing a developing process on the photoresist layer (as shown in FIG. 7-8). In various embodiments of the present disclosure, the tool 400 further includes a prebaking unit 404. The prebaking unit 404 is configured to baking the photoresist layer and initially driving solvents from the photoresist layer before the exposure process.

As the process window of formation of desired pattern profile in the photoresist film becomes more marginal with the more advanced technology node, patterning resolution is continually increased in lithography technology to fabricate such smaller critical CDs and fine patterns. While exposure wavelength is shortened and/or numerical aperture is increased for higher patterning resolution, the limited is produced and results in either V-shaped or undercut photoresist profiles as opposed to an ideal photoresist profile having vertical sidewalls. According to various embodiments of the present disclosure, the exposed photoresist layer is further treated with a chemical modifier, an acidic fluid or an alkaline fluid, to modify the distribution profile of the photo acids. Therefore, the undercut and/or the V-shaped profile could be modified by the chemical modifier, and transformed into the modified distribution profile of the photo acids, which has vertical walls.

According to various embodiments of the present disclosure, the method of lithography includes forming a photoresist layer on a substrate. The method further includes exposing the photoresist layer to form an exposed photoresist layer. The method further includes rinsing the exposed photoresist layer. The method further includes treating the exposed photoresist layer with a chemical modifier to form a modified photoresist layer. The method further includes baking the modified photoresist layer. The method further includes developing the modified photoresist layer.

According to other various embodiments of the present disclosure, the method of lithography includes forming a photoresist layer on a substrate, wherein the photoresist layer has a photo acid generator. The method further includes exposing the photoresist layer to form an exposed photoresist layer, wherein the exposed photoresist layer has photo acids generated by the photo acid generator. The method further includes rinsing the exposed photoresist layer. The method further includes treating the exposed photoresist layer with a chemical modifier to form a modified photoresist layer. A distribution profile of the photo acids in the exposed photoresist layer produced in the operation of exposing the photoresist layer is modified by the chemical modifier in the operation of treating the exposed photoresist layer, and the distribution profile of the photo acids in the exposed photoresist is modified into a modified distribution profile of the photo acids in the modified photoresist layer.

According to other various embodiments of the present disclosure, the tool for the methods of lithography includes a photoresist-coating unit, an exposure unit, a rinsing unit, a post-exposure treating unit, a hard-baking unit, and a developing unit. The photoresist-coating unit is configured to coating a photoresist layer on the substrate. The exposure unit is configured to performing an exposure process on the photoresist layer. The rinsing unit is configured to cleaning the photoresist layer after the exposure process. The post-exposure treating unit is configured to injecting a chemical modifier to a surface of the photoresist layer after the exposure process. The hard-baking unit is configured to baking the photoresist layer. The developing unit is configured to performing a developing process on the photoresist layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of modifying exposed portions of a photoresist layer containing diazonaphthoquinone (DNQ), wherein a photo-acidic distribution profile having slanting sidewalls that define a reduced portion is formed in the exposed portions of the photoresist layer, the method comprising:
   rinsing the exposed portions of the photoresist layer;
   enlarging the reduced portion of the exposed portions of the photoresist layer with an acidic fluid to form a modified photoresist layer;
   baking the modified photoresist layer; and
   developing the modified photoresist layer.

2. The method of claim 1, wherein the acidic fluid comprises: carbon oxides, nitrogen oxides, sulfur oxides, carbonic acid, nitric acid, sulfuric acid, or combinations thereof.

3. The method of claim 1, wherein enlarging the reduced portion of the exposed portions of the photoresist layer with the acidic fluid is performed after rinsing the exposed portions of the photoresist layer.

4. The method of claim 1, wherein enlarging the reduced portion of the exposed portions of the photoresist layer with the acidic fluid is performed by injecting a gas as the acidic fluid to a surface of the exposed portions of the photoresist layer.

5. The method of claim 1, further comprising
   forming the photoresist layer on a substrate; and
   exposing portions of the photoresist layer to form the exposed portions of the photoresist layer,
   wherein the substrate is substantially horizontal and stable during the exposing of the portions of the photoresist layer.

6. The method of claim 5, wherein the substrate is tilted and moving during the exposing of the portions of the photoresist layer.

7. The method of claim 1, wherein the photoresist layer comprises a material selected from the group consisting of: poly (4-t-butoxycarbonyloxystyrene), polymethylmethacrylate (PMMA), and tetrafluoroethylene (TFE).

8. A method of lithography, comprising:
   forming a photoresist layer on a substrate, wherein the photoresist layer has a photo acid generator that is diazonaphthoquinone, triphenylsulfonium, hexafluoroantimonate, or combinations thereof;
   exciting the photo acid generator to form exposed portions of the photoresist layer, wherein the exposed portions have slanting sidewalls, and the slanting sidewalls define a reduced portion pointing away from the substrate;
   rinsing the exposed portions of the photoresist layer; and
   enlarging reduced portion of the exposed portions of the photoresist layer with a chemical modifier to form a modified photoresist layer,
   wherein the reduced portion is modified by the chemical modifier, and the slanting sidewalls of the exposed portions of the photoresist layer are modified into vertical sidewalls in the modified photoresist layer.

9. The method of claim 8, wherein the chemical modifier comprises an acidic fluid, and the acidic fluid comprises: carbon oxides, nitrogen oxides, sulfur oxides, carbonic acid, nitric acid, sulfuric acid, or combinations thereof.

10. The method of claim 8, wherein the chemical modifier comprises an alkaline fluid, and the alkaline fluid comprises: ammonia, trimethylamine, ammonium hydroxide, tetramethyl ammonium hydroxide, sodium hydroxide, or combinations thereof.

11. The method of claim 8, wherein enlarging the reduced portion of the exposed portions of the photoresist layer with the chemical modifier is performed by injecting a gas as the chemical modifier to a surface of the exposed portions of the photoresist layer.

12. The method of claim 8, wherein the substrate is substantially horizontal and stable during excitation of the photo acid generator.

13. The method of claim 8, further comprising:
   baking the modified photoresist layer after enlarging the reduced portion of the exposed portions of the photoresist layer with the chemical modifier; and
   developing the modified photoresist layer to remove the exposed portions of the photoresist layer.

14. The method of claim 8, wherein the photoresist layer comprises a material selected from the group consisting of:

poly (4-t-butoxycarbonyloxystyrene), polymethylmethacrylate (PMMA), and tetrafluoroethylene (TFE).

15. The method of claim 8, wherein rinsing the exposed photoresist layer is performed by a liquid solvent selected from the group consisting of: water, acetone, or a combination thereof.

\* \* \* \* \*